United States Patent
Pfaffinger

(10) Patent No.: US 8,633,779 B2
(45) Date of Patent: Jan. 21, 2014

(54) PULSE WIDTH MODULATOR

(75) Inventor: Gerhard Pfaffinger, Regensburg (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 7 days.

(21) Appl. No.: 13/235,037

(22) Filed: Sep. 16, 2011

(65) Prior Publication Data

US 2012/0068781 A1 Mar. 22, 2012

(30) Foreign Application Priority Data

Sep. 21, 2010 (EP) .................................... 10177907

(51) Int. Cl.
*H03K 7/08* (2006.01)
(52) U.S. Cl.
USPC ........................................... 332/109; 375/238
(58) Field of Classification Search
USPC ........................................... 332/109; 375/238
See application file for complete search history.

(56) References Cited

U.S. PATENT DOCUMENTS

| | | | |
|---|---|---|---|
| 5,901,176 A | 5/1999 | Lewison | |
| 5,933,453 A * | 8/1999 | Lewison | ....................... 375/238 |
| 6,727,765 B1 | 4/2004 | Ess | |
| 2002/0084843 A1 | 7/2002 | Ruha | |
| 2005/0254573 A1 | 11/2005 | Midya et al. | |
| 2009/0326730 A1 | 12/2009 | Bjeljac et al. | |

OTHER PUBLICATIONS

Trzynadkowski et al., "Random Pulse Width Modulation Techniques for Converter-Fed Drive Systems—A Review", IEEE, vol. 30, No. 5, pp. 1166-1175.

* cited by examiner

*Primary Examiner* — Joseph Chang
(74) *Attorney, Agent, or Firm* — O'Shea Getz P.C.

(57) ABSTRACT

A pulse width modulator for modulating a rectangular carrier signal in accordance with an input signal includes a modulating unit that receives the input signal and provides a digital output word. The output word has a pre-defined number of digits comprising a first contiguous set of binary ones ("1") and a second contiguous set of binary zeroes ("0") and in which the fraction of the binary ones ("1") represents the digital input signal. The modulator also includes a random number generator that generates a pseudo-random sequence, and a flipping unit configured to flip, or not, the output word provided by the modulating unit in accordance with the pseudo-random sequence thus providing a randomly modified digital pulse width modulated output signal.

10 Claims, 5 Drawing Sheets

PULSE WIDTH MODULATOR

1. CLAIM OF PRIORITY

This patent application claims priority from EP Application No. 10 177 907.2 filed Sep. 21, 2010, which is hereby incorporated by reference.

2. FIELD OF TECHNOLOGY

The present invention relates to a digital pulse width modulator with reduced electromagnetic emissions.

3. RELATED ART

Pulse width modulation (PWM) is a known digital-to-analog conversion technique wherein the pulse width of a rectangular signal is modulated with a modulation signal that can assume a finite or infinite number of values within a given interval. For example, a voltage signal within a range from −15 V to 15 V can be transformed to a pulse width modulated rectangular signal that only has two states, namely −15 V and +15 V. The duty cycle of the pulse width modulated rectangular signal represents the voltage value of the voltage signal (i.e., the modulation signal) whereby, in the present example, a duty cycle of 50 percent corresponds to 0 V, a duty cycle of zero percent corresponds to −15 V, and a duty cycle of 100 percent corresponds to +15 V. The frequency of the modulated rectangular signal is thereby usually constant and denoted as PWM frequency. The spectrum of a pulse width modulated signal is composed of the spectrum of the modulation signal and further spectral components due to the rectangular carrier signal, which are the PWM frequency and corresponding higher harmonics. Thus, the original signal (modulation signal) can be reconstructed from the pulse width modulated signal by low pass filtering. However, dependent on the application, complex filter circuits have to be employed to provide damping of the PWM frequency and the related harmonics. Nevertheless these spectral components due to the carrier generally occur in the radio frequency band and thus cause undesired electromagnetic interferences (EMI).

PWM modulators are commonly used in switched power supplies. In addition, pulse width modulation is also applied to audio signals in so called Class D amplifiers. In order to reduce ripple voltage in switched power supplies or to improve signal-to-noise ratio (SNR) of digital amplifiers, to allow for relatively simple and inexpensive filter circuits, and to improve electromagnetic compatibility (EMC) of PWM applications there is a need for an improved PWM method and corresponding system.

SUMMARY OF THE INVENTION

A modulator includes a modulating unit that receives a digital input signal and generates a digital output word, in which the output word has a pre-defined number of digits comprising a first contiguous set of "1" and a second contiguous set of "0" digits and in which the fraction of "1" digits represents the digital input signal. The modulator also includes a random number generator that generates a pseudo-random sequence and a flipping unit that selectively flips, or not, the output word provided by the modulating unit in accordance with the pseudo-random sequence thus providing a randomly modified digital pulse width modulated output signal.

DESCRIPTION OF THE DRAWINGS

The present invention can be better understood with reference to the following drawings and description. The components in the drawings are not necessarily to scale, emphasis instead being placed upon illustrating the principles of the invention. Moreover, in the figures, like reference numerals designate corresponding parts throughout the different views. In the drawings.

DETAILED DESCRIPTION OF THE INVENTION

Figure 1:
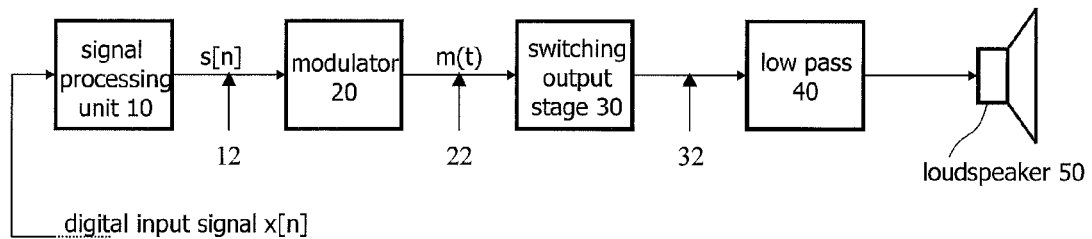
FIG. 1 is a block diagram illustration of a known Class D amplifier system.

FIG. 1 is a block diagram illustrating digital class D audio amplifier using a PWM modulation. A digital input signal x[n] is input to a digital processing unit 10 that performs audio signal processing tasks, such as for example, equalizing or the like. The processed digital audio signal, denoted as s[n], is output on a line 12 to a PWM modulator 20 that modulates a rectangular carrier signal with the audio signal s[n] to provide a corresponding PWM signal m(t) on line 22. The PWM signal m(t) on the line 22 has a pre-defined period (PWM period $T_{PWM}$) which is reciprocal of the PWM frequency $f_{PWM}$. The PWM signal m(t) is amplified by a switching output stage 30, which may be implemented as a transistor half-bridge connected between a positive and a negative supply line. The output stage 30 provides an amplified PWM signal on line 32 that is filtered by a low-pass filter 40 (alternatively a band pass filter) and supplied to a load which is, in the present example, a loudspeaker 50.

It should be noted that the class D amplifier is one exemplary application of a PWM modulator according to aspects of the present invention, but of course there are many other applications for the improved PWM. For example, other applications in which PWM modulators may be useful, include for example, DC motor control, switched mode power supply, et cetera.

In the following discussion mainly digital signals are used, thus e.g., a discrete time signal x is written as x[n] wherein the symbol n enclosed by square brackets denotes the time index being an integer number. Similarly, a continuous time signal x is referred to as x(t) in which the symbol t enclosed by round brackets denotes the time being a real number. As digital and analog implementations may be equivalent in many cases, the following applies to both digital and analog signals if not explicitly noted.

Figure 2:
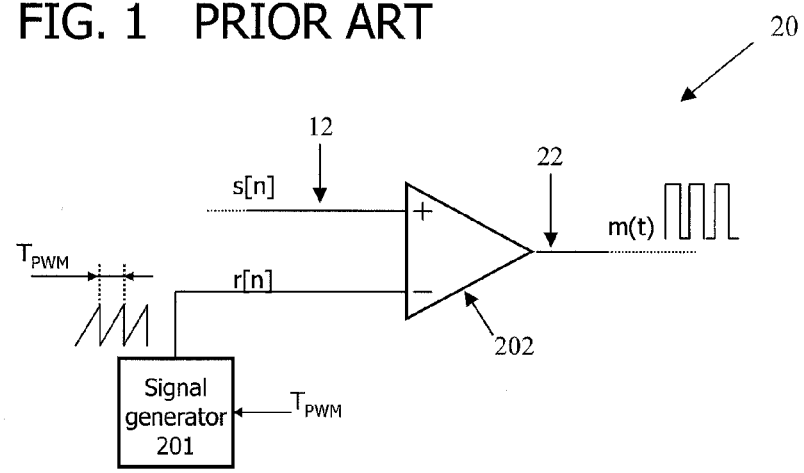
FIG. 2 is a block diagram illustration of a known PWM modulator.

FIG. 2 is a block diagram illustration of the conventional PWM modulator 20, which comprises a sawtooth signal generator 201 that provides a sawtooth signal r[n] that has a rising edge with a defined slope. Alternatively, the saw-tooth signal may be replaced by a corresponding staircase signal especially when employing a digital implementation. Every PWM period $T_{PWM}$ ($1/f_{PWM}$) the signal r[n] ramps up (e.g., continuously or in steps) from a minimum value $r_{min}$ to a maximum value $r_{max}$. At the end of every period the sawtooth (or staircase) signal is reset from $r_{max}$ to $r_{min}$. The input signal s[n] on the line 12 is compared to the reference signal r[n]. As long as the reference signal r[n] is lower than the input signal s[n] (i.e., while r[n]<s[n]) a comparator unit 202 outputs a high signal (ON value). As soon as the reference signal r[n] exceeds the input signal s[n] (i.e., when r[n]≥s[n]) the comparator unit 202 outputs a low signal (OFF value). The length of the time interval during which the modulator output on the line 22 is high is denoted as ON time $T_{ON}$ and the ratio $T_{ON}/T_{PWM}$ of ON time $T_{ON}$ and PWM period $T_{PWM}$ is defined as duty cycle which depends linearly from the input signal value s[n]. The present example refers to a so-called leading edge PWM modulator as the sawtooth signal r[n] ramps up every PWM period. However, trailing edge PWM and double edge PWM modulators may also be used.

Figure 3:
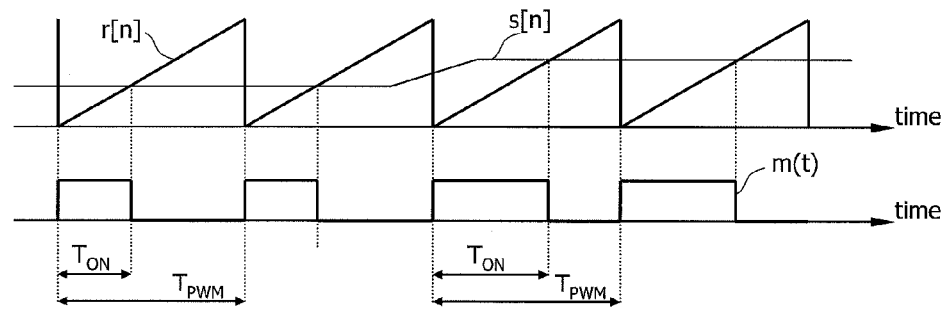
FIG. 3 graphically illustrates the function of the PWM modulator of FIG. 2.

The function of the PWM modulator as discussed above is illustrated in FIG. 3 by timing diagrams of the input signal s[n], the saw-tooth signal r[n] and the modulated signal m(t). It can be seen from FIG. 3 that the duty cycle $T_{ON}/T_{PWM}$ of the PMW output signal m(t) on the line 22 is modulated in accordance with the input signal s[n]. The modulated signal m(t) is at a high level while r[n]<s[n] (i.e., during the time interval $T_{ON}$), and at a low level while r[n]>s[n] (i.e., during the rest of the PWM period $T_{PWM}$). As a consequence the duty cycle of the modulated signal m(t) is proportional to the level of the input signal s[n]. Thus, the modulated signal m(t) is a digital representation (comprising only high and low levels) of the input signal s[n]. The example illustrated in the bottom diagram of FIG. 3 is called a standard PWM or "leading edge" PMW as the rising edge and thus the on-period always $T_{ON}$ occurs at the beginning of a PWM period $T_{PWM}$. Alternatively, a "trailing edge" PWM may be used where the on-period occurs at the end of a PWM period $T_{PWM}$.

Figure 4:
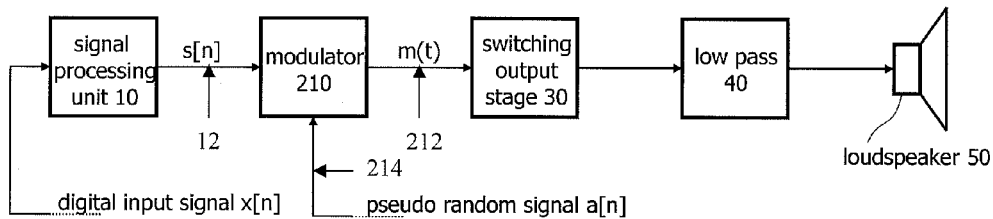
FIG. 4 is a block diagram illustration of a Class D amplifier system including a MLS-PWM modulator according to an aspect of the invention.

FIG. 4 is a block diagram illustration of a class D audio amplifier using an enhanced PWM modulation. As in the example of FIG. 1, a digital input signal x[n] is supplied to the digital processing unit 10, which may perform audio signal processing tasks such as equalizing or the like. The processed digital audio signal s[n] on line 12 is input to PWM modulator unit 210 which modulates a carrier signal with the audio signal s[n] to provide a PWM output signal m(t) on line 212 whose duty cycle represents the current level of the input signal s[n] on the line 12. The PWM output signal m(t) on the line 212 has a PWM period denoted as $T_{PWM}$ that is reciprocal of the PWM frequency $f_{PWM}$. The PWM output signal m(t) is amplified, subsequently filtered by, for example, a low-pass filter 40 and supplied to a load which is, in the present case, a loudspeaker 50.

The PWM modulator 210 receives a random or pseudo-random signal a[n] on a line 214 (e.g., white or colored noise). Several methods of generating pseudo-random signal or sequences are known. For example, Maximum Length Sequences (MLS) may be used to generate the digital pseudo-random signal a[n] on the line 214. In this embodiment, the modified PWM modulator is therefore also called MLS-PWM modulator 20. The random signal a[n] on the line 214 is used for deciding randomly and separately for each PWM period whether to place the on period $T_{ON}$ of a full PWM period $T_{PWM}$ at the beginning of the end of the PWM period $T_{PWM}$. As a consequence, the magnitudes of the spectral components due to the rectangular carrier signal having a frequency of $f_{PWM}$ and higher harmonics are significantly reduced in the spectrum of the PWM output signal m(t) thereby reducing electromagnetic interference (EMI) and improving electromagnetic compatibility (EMC) of the overall application in which the MLS-PWM modulator is used.

Figure 5:
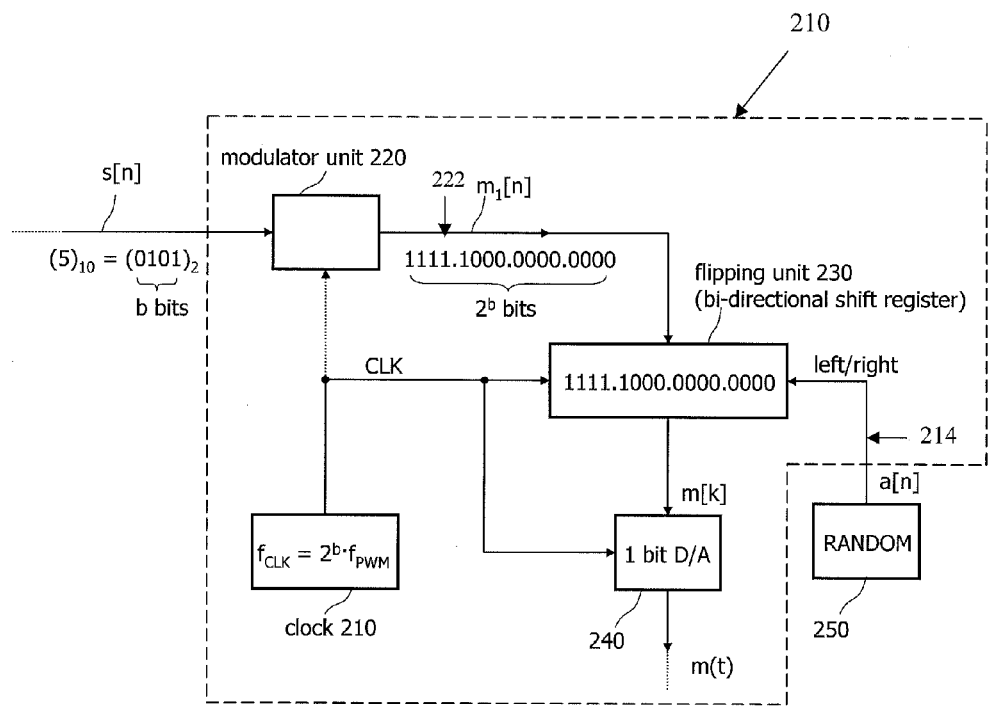
FIG. 5 illustrates an embodiment of the MLS-PWM modulator of FIG. 4.

FIG. 5 illustrates an embodiment of the PWM modulator 210, which may be used, for example, in the class D amplifier illustrated in FIG. 4. The PWM modulator 210 illustrated in FIG. 5 may receive a four bit digital input signal s[n] which has for example a binary value (at the discrete time n) of 0101 which represents the numeral 5 in the decimal system. The input signal s[n] is input to a modulation unit 220 which outputs a 16-bit word $m_1$[n] on a line 222 having a number of digits "1" corresponding to the current value of s[n], in the present case the 16 bit word $m_1$[n] is composed of five digits "1" and eleven digits "0" as the current value of the input signal s[n] equals five (i.e. binary 0101). Generally, the output signal $m_1$[n] of the modulator 220 is a sequence of $2^b$ bit words, in which b is the number of bits of the input signal s[n] (i.e., b=4 and $2^b$=16 in the present example).

The output signal $m_1$[n] on the line 222 can be regarded as digital PWM signal, as the word $m_1$[n] is composed of a set of s[n] (equals 5 in the present example) subsequent digits "1" followed by a set of $2^b$-s[n] (equals 11 in the present example) subsequent digits "0" thus forming a kind of digital standard (leading edge) PWM sample representing one PWM period $T_{PWM}$. Converting such a digital PWM signal $m_1$[n] bitwise to an analog signal using a 1-bit D/A converter with a conversion rate of $2^b \cdot f_{PWM}$ directly yields a PWM signal as it would be achieved with the modulator of FIG. 2. Thereby the 1-bit D/A converter might be implemented in a relatively simple way as a single switch. However, a more sophisticated D/A-conversion might be appropriate dependent on the application.

Before D/A conversion the digital PWM signal $m_1$[n] on the line 22 is supplied to a flipping unit 230, configured to flip, or not, the $2^b$-bit word $m_1$[n] representing the current modulator output in accordance with the current value a random (or pseudo random) signal a[n]. The flipping unit 230 may be implemented, for example, as a bi-directional shift register (e.g., in a hardware implementation) or, alternatively, as a switchable FIFO/FILO memory (in particular in a software implementation). The switchable FIFO/FILO may be regarded as a software implementation of a bi-directional shift register. Furthermore, special machine instructions may be available for performing the flipping operation when using an appropriate digital signal processor. In the present example, the flipping unit 230 may be seen as a shift register into which the current value ($2^b$-bit word) of the digital PWM signal $m_1$[n] on the line 222 is loaded once each PWM period. Then the 2b-bit word $m_1$[n] is left or right shifted (in accordance with the random value a[n]) to provide a serial output stream (having for example a clock rate of $2^b \cdot f_{PWM}$) which is supplied to the 1-bit D/A converter 240 to generate an analog PWM signal m(t). Whether to shift the $2^b$-bit word $m_1$[n] right or left depends on the random value of the signal a[n] on the line 214. For example, the word $m_1$[n] may be left shifted if the current random value a[n] is "1" thus leaving the bit sequence of $m_1$[n] unchanged, and the word $m_1$[n] may be right shifted if the current random value a[n] is "0" thus reverting (i.e. flipping) the bit sequence of $m_1$[n].

Figure 6:
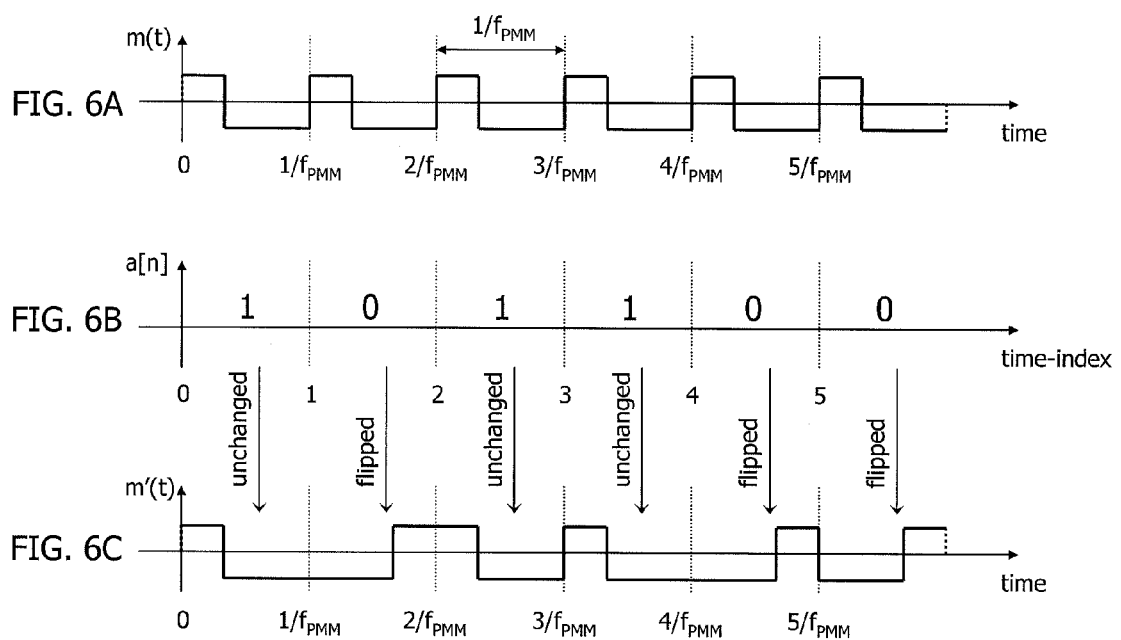
FIGS. 6A-6C illustrates the effect of the MLS pulse width modulation by timing diagrams of the modulated PWM signal.

The function of a MLS-PWM modulator 210 including the flipping device 230 is further illustrated by the timing diagrams of FIGS. 6A-6C. FIG. 6A illustrates the digital-to-analog-converted PWM output signal m(t) that would be observed if no flipping unit 230 would be present. The PWM signal m(t) in FIG. 6A represents a conventional leading-edge PWM signal having a PWM period $f_{PWM}^{-1}$. FIG. 6B represents the random sequence a[n] provided by the random generator 250. The random sequence may be, e.g., a Maximum-Length Sequence. As described above, the sequence a[n] may be assumed as, for example, a pseudo-random sequence in which the output word of the modulator unit 220 representing one PWM period is reverted (flipped) if the corresponding random value a[n] is "0" and remains unchanged if the corresponding random value a[n] is "1". As a result, the leading-edge PWM signal illustrated in FIG. 6A is flipped to a trailing-edge PWM signal during PWM periods associated with a random value "0". No flipping is performed during PWM periods associated with a random value "1". Of course the random sequence may be inverted without changing the function of the MLS-PWM modulator 210.

Figure 7:
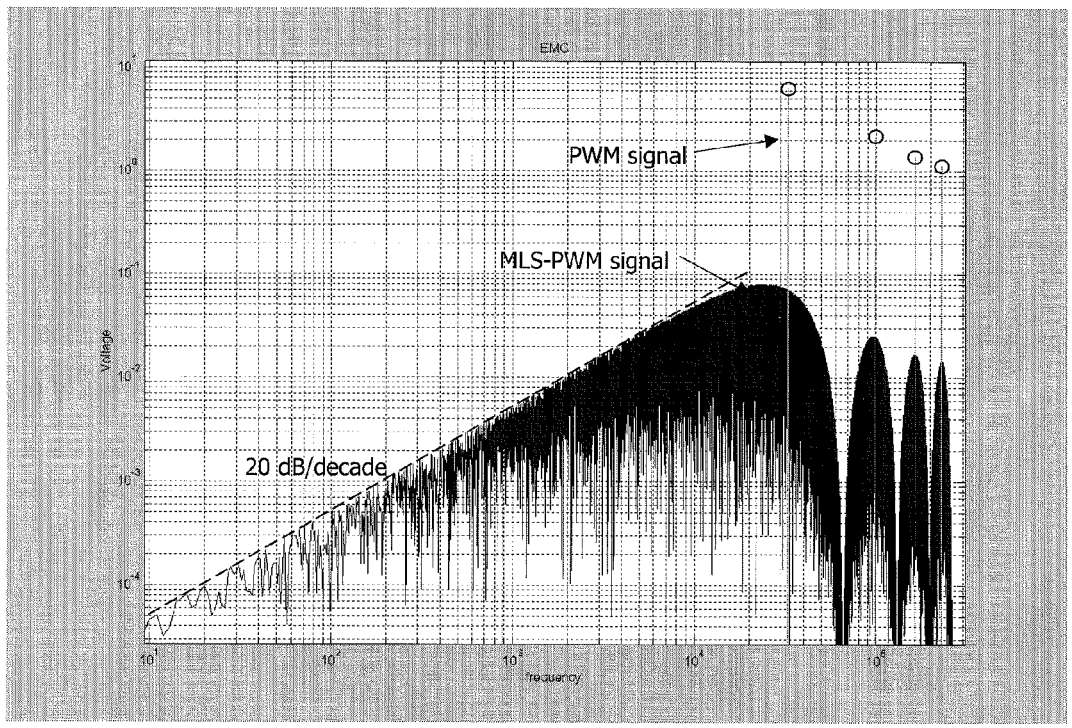
FIG. 7 illustrates the spectrum of a MLS PWM signal compared to the spectrum of a conventional PWM signal.

With the MLS-PWM modulator 210 as described for example with respect to FIGS. 5 and 6A-6C it is possible to generate a pulse width modulated signal without having a prominent spectral line at the PWM frequency $f_{PWM}$ and higher harmonics. That is, randomly changing the operating mode of the PWM modulator 210 from leading-edge PWM to trailing-edge PWM and vice versa reduces the mentioned spectral lines and the power of the PWM carrier signal is distributed over a broad spectral range, thus, eliminating the prominent spectral line at $f_{PWM}$ and corresponding higher harmonics. This effect can be observed in the diagram of FIG. 7.

Figure 8:
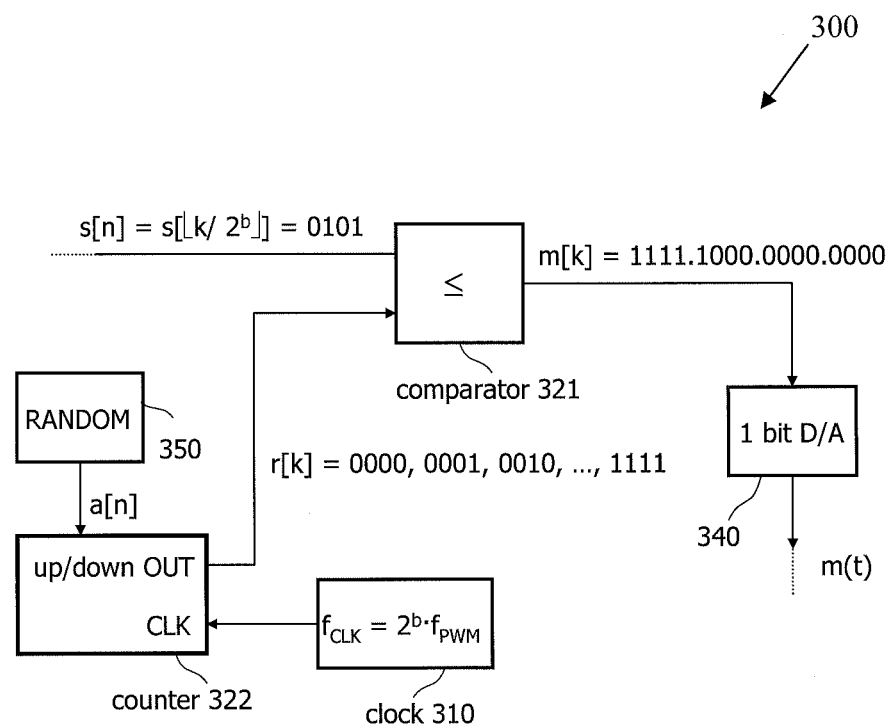
FIG. 8 illustrates another embodiment of a MLS-PWM modulator.

An alternative embodiment of an MLS-PWM modulator 300 providing a randomly (in accordance with the random signal a[n]) leading-edge or trailing-edge PWM signal m(t) is illustrated in FIG. 8. Although the flipping unit 230 is not directly shown, the flipping unit can be seen as that part of counter 322, which is responsible for switching from a "count up" to a "count down" mode. As an example, the counter 322 may be a 4-bit counter 322 (i.e., b=4) counts up, starting from a minimum value (e.g., 0000) thus generating a staircase sequence r[k]. When reaching the maximum value (e.g., 1111), a counter overflow occurs and counting restarts from the minimum value (e.g., 0000). The counter is clocked with a clock signal of a frequency being a factor $2^b$ (e.g., a factor 16 in the present example) higher than the PWM frequency $f_{PWM}$ (see clock generator 310). The staircase sequence r[k] as well as the input signal s[n] (the time index n being $\lfloor k/2^b \rfloor$, $\lfloor \cdot \rfloor$ denoting the floor function) are fed into comparator unit 321, which generates a high level (i.e., binary "1") at its output as long as $s[\lfloor k/2^b \rfloor] \leq r[k]$ and low level (i.e., binary "0") otherwise. Thus the comparator output is a serial $2^b$-bit word m[k] representing a digital leading-edge PWM signal yielding the analog PWM output signal m(t) when D/A converted as in the example of FIG. 5.

When switching the mode of operation of the counter to "count down" in accordance with the current random value of signal a[n], then the leading-edge PWM is transformed into a trailing edge PWM and the output word of the comparator 321 is reverted (flipped) thus yielding a trailing-edge PWM signal m(t). In view of the above, the counter 322 in combination with the comparator 321 can be seen as modulator unit in comparison to the embodiment illustrated in the example of FIG. 5, and that part of the counter 322, which is responsible for switching from a "count up" to a "count down" mode, can be seen as the flipping unit 230 (FIG. 5).

Although the present invention and its advantages have been described in detail, it should be understood that various changes, substitutions, and alterations can be made herein without departing from the spirit and scope of the invention as defined by the appended claims. For example, it will be readily understood by those skilled in the art that the logic levels may be inverted or serial bit-streams may be used instead of parallel bit-streams while remaining within the scope of the present invention.

Moreover, the scope of the present application is not intended to be limited to the particular embodiments of the invention described in the specification. As one of ordinary skill in the art will readily appreciate from the disclosure of the present invention, modulators and methods, that perform substantially the same function or achieve substantially the same result as the corresponding embodiments described herein may be utilized according to the present invention.

What is claimed is:

1. A pulse width modulator for modulating a rectangular carrier signal in accordance with an input signal s[n], the modulator comprises:
    a modulating unit that receives the input signal s[n] and generates a digital output word, the output word having a pre-defined number of digits ($2^b$) comprising a first contiguous set of "1" and a second contiguous set of "0" digits in which the fraction of "1" digits represents the digital input signal s[n];
    a random number generator that generates a random sequence a[n]; and
    a flipping unit that receives the random sequence a[n] and the output word and selectively flips, or not, the output word in accordance with the pseudo-random sequence a[n] to provide a randomly modified digital pulse width modulated output signal.

2. The pulse width modulator of claim 1, in which the flipping unit comprises a bidirectional shift register and its shifting direction is set in accordance with the pseudo-random sequence.

3. The pulse width modulator of claim 1, in which the flipping unit comprises a buffer that operates in a FIFO mode or a FILO mode in accordance with the pseudo-random sequence a[n].

4. The pulse width modulator of claim 1,
    where the modulating unit comprises a counter that generates a staircase signal r[k] and a digital comparator that receives the input signal s[n] and the staircase signal r[k], and the comparator provides the output word m[k] of the modulating unit, and
    where the flipping unit switches the counter from a count up mode to a count down mode and vice versa in accordance with the pseudo-random sequence a[n].

5. The pulse width modulator of claim 1, further comprising a 1-bit digital-to-analog converter that converts the randomly modified digital pulse width modulated output signal m[k] to a corresponding analog signal m(t).

6. The pulse width modulator of claim 1, where the random sequence a[n] is a Maximum Length Sequence.

7. The pulse width modulator of claim 1, where
    the input signal s[n] received by the modulating unit is a b-bit word representing an input sample to be PWM modulated; and
    in which the output word m[k] provided by the modulating unit is a $2^b$-bit word.

8. The pulse width modulator of claim 4, where
    the input signal s[n] received by the modulating unit is a b-bit word representing an input sample to be PWM modulated; and
    the counter is clocked by a clock generator to provide a clock signal having a frequency ($f_{CLK}$) being a factor $2^b$ higher than a PWM frequency.

9. The pulse width modulator of claim 8, where the pulse width modulated output signal is, in accordance with the value of the random signal, a leading edge PWM signal or a trailing edge PWM signal.

10. The pulse width modulator of claim 1, further comprising a microprocessor programmed to implement the function of the random number generator, the modulating unit and the flipping unit.

* * * * *